Sept. 6, 1966 F. W. GUTZWILLER 3,271,700

SOLID STATE SWITCHING CIRCUITS

Filed March 1, 1963 2 Sheets-Sheet 1

INVENTOR:
FRANK W. GUTZWILLER,
BY Urban H. Faubion
HIS ATTORNEY.

SOLID STATE SWITCHING CIRCUITS

Filed March 1, 1963 2 Sheets-Sheet 2

INVENTOR:
FRANK W. GUTZWILLER,
BY Urban H. Faubion
HIS ATTORNEY.

United States Patent Office 3,271,700
Patented Sept. 6, 1966

3,271,700
SOLID STATE SWITCHING CIRCUITS
Frank W. Gutzwiller, Auburn, N.Y., assignor to General Electric Company, a corporation of New York
Filed Mar. 1, 1963, Ser. No. 262,035
16 Claims. (Cl. 332—14)

This invention relates to control circuitry for effecting switching operations which circuitry is especially (but not exclusively) useful for switching operations where the voltage source is unidirectional. More particularly, the invention relates to such control circuitry which is capable of performing the switching function to control high load currents using a solid state gate turn-off controlled switch.

The functional requirement for the solid state gate turn off switch is that it provide a complete switching action. That is to say, the device should have the capability of being switched between its conducting (low impedance) and non-conducting (high impedance) states by changing conditions on a control electrode (gate). A gate turn-off controlled switch of the type used in the control circuitry under consideration is described and claimed in copending application Serial Number 210,364 filed July 17, 1962, in the name of Richard W. Aldrich and Nick Holonyak, Jr., which is assigned to the assignee of the present application. Such gate turn-off switches are now commercially available. Since the operation of the controlled switch is so important to an understanding of the circuitry, a description of the switch and its operation is given below before proceeding with the description of the circuitry.

These switches are of the four-layer PNPN or NPNP type. The operating principles may be understood by considering the PNPN embodiment. The PNPN device is provided with an anode comprising the external P layer, a cathode comprising the opposite, external N layer and a gate connected to the internal P layer. For descriptive purposes, the PNPN four-layer structure may be considered analogous to two conceptual transistors, viz, a PNP transistor and an NPN transistor, which have the internal N and P layers common thereto. In effect, the collector of each transistor supplies current to the base of the other. Each of the conceptual transistors has a characteristic current gain, which is defined as the fraction of the current injected at the emitter which reaches the collector, or to state it in another way, the ratio of collector to emitter currents. The current gain is a function of emitter current, and thus, by varying the emitter current, the sum of the current gains of the two transistors may be made to vary.

The turn-on mechanism or technique for the four-layer devices is well known and comprises essentially introducing sufficient current at the gate to cause an increase in emitter current, and hence an increase in current through the device, by transistor action. The increasing current causes an increase in the current gains, the rate of increase in the current gains being fairly rapid due to the presence of special impurity centers in the layers of the solid state device. The increasing current gains then permit an increased flow of current through the device in a contributarily cumulative manner such that conduction of the device rapidly becomes self-regenerative. Physically, in the "on" condition, the internal regions are saturated with carriers, making all three of the junctions between the four layers forward-biased. The entire potential drop across the device approaches that of one forward biased PN rectifier. In the two-transistor analogy, the sum of the current gains is substantially unity when the self-regenerative mode has been reached; in a more practical sense, in view of losses not accounted for in a theoretical treatment, and to avoid a questionable status of conduction in that a slight decrease in the current gains might render the device non-conductive, the sum of the current gains is required to exceed unity for the device to remain in the self-regenerative mode of conduction. As the self-regenerative mode implies, no further gating current is required to maintain conduction.

Two means exist for turning off such a device. One means comprises removing the biasing potential, which means, as implemented in a practical circuit, would require opening the load circuit, reversing the potential existing across the device, or providing a shunt path around the device. The other means comprises withdrawing current from the gate, thus diverting anode current and thereby draining the carriers from the internal regions and "starving" the junctions. This results in a decrease in current flow to the cathode. If the withdrawn current is large enough, the device will return to its blocking state. Due to the self-regenerative mode attained during conduction, however, the magnitude of current required to be withdrawn from the gate would approach the normal conduction current of the device. This mode of turn-off cannot be employed in most PNPN solid state rectifiers due to inherent limitations on the current handling capabilities of the gate. Nevertheless, in view of the difficulties encountered when terminating conduction by the first means described, which requires switching circuits handling the load current, the desirability of a PNPN device capable of being turned off at its gate is obvious.

In the foregoing application, a very practical device is disclosed in which turn-off may be achieved by withdrawing current from the gate. For this to be done in a practical manner, the current which must be removed from the gate in order to turn the device off should be small in comparison to the load current switched. In other words, the practical device should exhibit turn-off gain, where turn-off gain is defined as the ratio of the load current which is turned off to the gate current which is required to turn that current off. In still other words, the device must respond to the withdrawal of gate current in an amplified manner.

In order to obtain the desired turn-off gain, the device is designed so that withdrawal of gate current effects a reduction of the sum of the current gains of the conceptual transistors to a value below unity, whereupon the self-regenerative mode ceases and the conduction of the device is rapidly terminated. In order to design such devices, it is necessary to understand that the device sensitivity to turn off is a function of the ratio and magnitude of the current gains of the conceptual transistors and to realize that the individual current gains must be less than unity if the device is to turn-off. Extremely high sensitivity to turn-off is achieved when the ratio of current gains is about two orders of magnitude. It is desirable that the gate currents (triggering signals) which effect turn-on and turn-off of the device be of the same order of absolute magnitude to facilitate the employment of these devices in practical circuitry applications. By properly adjusting the ratio of the current gains, the gate current required for turn-off may be made about the same magnitude as that required for the turn-on. In a practical device described in the Aldrich et al. patent application, supra, the ratio of the current gain of the NPN section to that of the PNP section is about an order of magnitude.

Because the devices under consideration here (and those taught in the foregoing application( are capable, as a practical matter, of being turned off by withdrawing relatively small amounts of current from the gate, they shall be referred to herein as "gate turn-off" devices, or by the initials GTO.

The present invention has to do with circuitry making use of such GTO devices and has for its objects to provide circuits particularly effective and useful in connection with GTO devices. The circuitry further provides control of high magnitude load currents in a greatly simplified, efficient and rapid manner.

It is therefore an object of the present invention to provide an improved and simplified arrangement for both initiating and terminating the conduction of a GTO.

Another object of the present invention is to provide an improved circuitry arrangement utilizing a GTO to rapidly switch high current loads in a simplified, efficient, and rapid manner.

A further object of the present invention is to provide an improved circuitry arrangement employing a minimum number of components and possessing long life and high efficiency in operation for rapidly switching high load currents.

In carrying out this invention in one form thereof, the GTO is connected at its anode to a positive power supply terminal and at its cathode through a resistance or a parallel combination of resistance and capacitance to a negative power supply terminal. Switching means connected to the gate of the GTO provides selective connection of the gate to the positive power supply terminal to initiate conduction of the GTO or to the negative power supply terminal to terminate conduction of the GTO. The unique characteristics of the GTO, providing gain in both the turn-on and turn-off modes, enable control of high load currents by a low-current control signal.

For a better understanding of the invention, reference may be had to the following detailed description and drawings of illustrative embodiments thereof in which.

Figure 1:
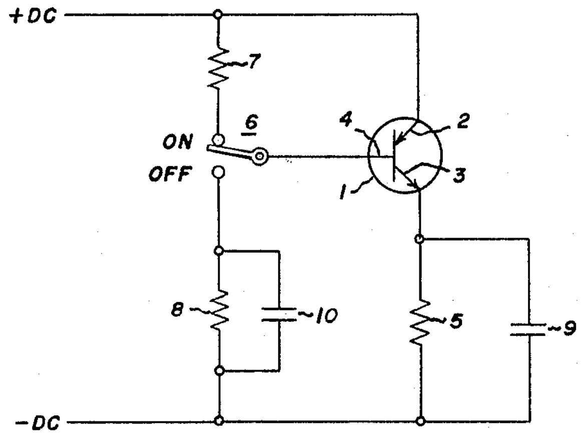
FIGURE 1 shows in a schematic form the basic circuit of the invention.

The circuit of FIGURE 1 teaches a basic, practical circuit for switching a load voltage which circuit is particularly suitable for switching a GTO between its conductive and non-conductive states. GTO 1 is provided with anode 2, cathode 3 and gate 4. Anode 2 is connected to a positive power supply terminal (+D.C.) and cathode 3 is connected through a resistive load impedance 5 to a negative power supply terminal (−D.C.). A switch 6 is provided to selectively connect the gate 4 to either the positive terminal or to the negative terminal of the power supply.

In operation, the power supply biases the GTO to condition it for conduction. During the quiescent, or "off" state of the GTO 1, the entire source potential appears across the anode 2 and the cathode 3. To initiate conduction of the GTO switch 6 is thrown to its "on" position (as illustrated), thereby connecting gate 4 through the dropping resistor 7 to the positive power supply terminal. The application of the positive potential to gate 4 then initiates the self-regenerative conduction of the GTO 1, the impedance of GTO 1 then becomes negligible. Substantially, the entire potential of the power supply appears across the load resistance 5 in the circuit of FIGURE 1. Since the load resistance 5 is connected between the cathode 3 and the negative power supply terminal, the potential at cathode 3 is substantially that of the positive power supply terminal. To terminate conduction, switch 6 is thrown to its "off" position, thereby connecting gate 4 through dropping resistor 8 to the negative power supply terminal, to establish a lower potential at the gate 4 than that existing at the cathode 3. This potential relationship, established due to the relative values of the resistor 5 and the resistor 8, effects the withdrawal of current from gate 4 to divert the anode current within GTO 1 to turn off the GTO 1.

The relationship of the values for the load resistance 5 and gate potential controlling resistor 8 for turn-off can be derived starting from the expression which states that the potential at gate 4 must be lower than that at the cathode 3.

That is, $$V_{gate} \leq V_{cathode}$$

Without capacitors 9 and 10, those voltages can be expressed as $$I_{gate}R_8 \leq I_{cathode}R_5 \quad (1)$$

The anode current through the device ($I_{anode}$) is equal to the sum of the gate and cathode currents $I_{gate}$ and $I_{cathode}$; or $$I_{anode} = I_{gate} + I_{cathode} \quad (2)$$

or $$I_{cathode} = I_{anode} - I_{gate} \quad (3)$$

By definition, the product of the device turn-off gain $A_G$ and the gate current ($I_{gate}$) required to turn the GTO off is equal to that anode current which is turned off. Or, in equation form $$I_{anode} = A_G \times I_{gate} \quad (4)$$

Starting with Equation 1 we see that for turn off $$\frac{R_8}{R_5} \leq \frac{I_{cathode}}{I_{gate}} \quad (5)$$

substituting 3 in 5

$$\frac{R_8}{R_5} \leq \frac{I_{anode} - I_{gate}}{I_{gate}} \quad (6)$$

substituting 4 in 6

$$\frac{R_8}{R_5} \leq \frac{A_G I_{gate} - I_{gate}}{I_{gate}} \quad (7)$$

or $$\frac{R_8}{R_5} \leq A_G - 1 \quad (8)$$

In other words, the ratio of the value of turn-off resistor 8 to that of the load resistor 5 must be less than or equal to the turn-off gain $A_G$ of GTO 1 minus 1.

The circuit of FIGURE 1 provides a relatively simple, yet highly effective switching circuit for a GTO. As therein shown, a simple switch, such as a single pole double throw reed switch, may be employed in a low current level switching circuit to control the flow of load currents which are measured in amperes. Limitations are presently device limitations. The control thus provided is low in cost, yet efficient, safe, effective, non-sparking, non-explosive, and long lived.

For higher load currents, the turn-off action is enhanced by the addition of capacitor 9 in parallel with the resistive load 5. During conduction of GTO 1, its forward impedance drops to a minimal magnitude, and capacitor 9 charges directly from the power supply by the flow of current when GTO 1 is turned on. When conduction is to be terminated, switch 6 is thrown to its "off" position, as mentioned, thereby connecting gate 4 to the negative power supply terminal. The charge stored on capacitor 9 maintains a positive potential at the cathode 3 and effects a reverse bias of the cathode-gate region to assist the earlier described turn-off operation.

Capacitor 10 may be added to the circuit in parallel with resistor 8 to provide a momentary low impedance path, or a short circuit to ground shunting resistor 8. Thus, any transients or other disturbances which would be deleterious to the turn-off action and which may be experienced upon connection of the switch 6 to its off position will be suppressed.

In many instances, inherent load or filter capacitance will suffice and the capacitors 9 and 10 may be considered to represent such inherent capacity. Even where desired to be used, the capacitive elements are smaller than those which would otherwise be required for turning off conventional controlled rectifiers. Further, the unidirectional nature of the circuitry permits the use of polarized capacitors.

Figure 2:
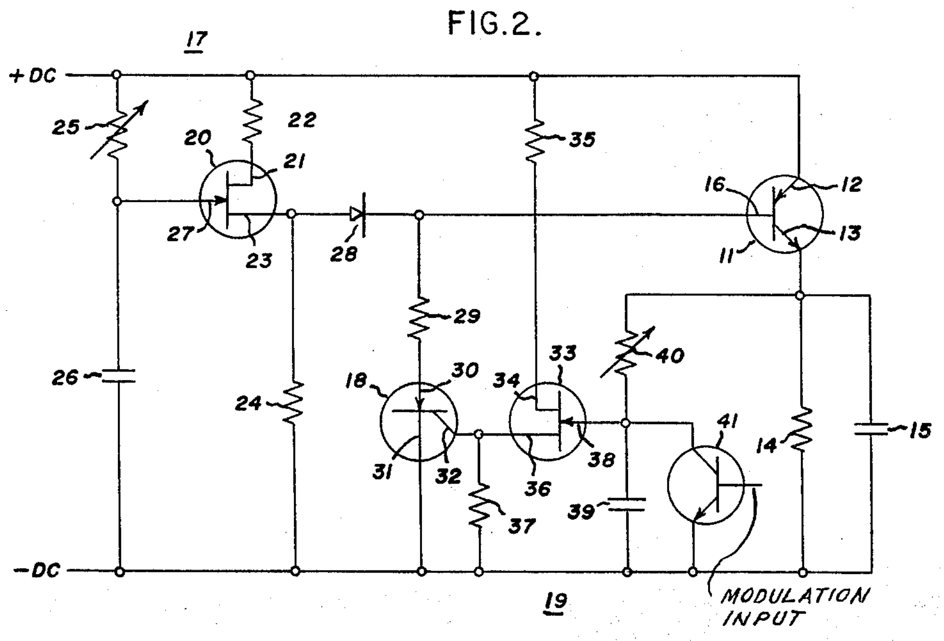
FIGURE 2 shows an embodiment of the invention employing pulse width and/or pulse timing modulation circuitry to initiate or terminate conduction of a GTO.

A circuit for switching the conduction of a GTO which can be used for pulse width modulation, pulse timing modulation or a combination of the two is shown in FIGURE 2. The main power circuit comprises GTO 11 which is connected through its anode 12 to the positive power supply terminal; the cathode 13 of GTO 11 is connected through a resistor 14 (load resistor as illustrated) to the negative power supply terminal. Capacitor 15 may be connected in parallel with resistor 14, where desired, to assist the turn-off of GTO 11. Capacitor 15 performs the same function as capacitor 9 of FIGURE 1, the latter having been discussed in detail above. The gate 16 of GTO 11 is connected to a unijunction relaxation oscillator 17 which provides triggering pulses to effect turn-on of the GTO 11. The gate 16 is also connected to a controlled rectifier 18, the conduction of which is regulated by a second similar unijunction relaxation oscillator 19. The controlled rectifier used is a silicon controlled rectifier and, therefore, is hereinafter designated by the initials SCR. Conduction of SCR 18 connects the gate 16 to the negative terminal of the power supply to effect turn-off of GTO 11.

The time at which conduction of GTO 11 is started is determined by the firing of unijunction relaxation oscillator 17. The duration of conduction of GTO 11 is determined by firing of unijunction relaxation oscillator 19. Since the firing rate of relaxation oscillator 17 is determined by the magnitude of variable resistor 25, the turn on timing of GTO 11 can be varied or modulated by variation of the magnitude of this resistor. This provides pulse timing modulation. Since the duration of conduction (pulse width) of GTO 11 is determined by the firing rate of oscillator 19, which is in turn determined by the value of resistance 40, pulse width modulation is provided by modulating or varying the magnitude of this resistor. Variation or modulation of the values of both resistor 40 and resistor 25 provides both pulse width and pulse rate modulation.

Unijunction relaxation oscillators such as oscillators 17 and 19 are illustrated and described in detail in Patent 2,780,752, issued February 5, 1957 to R. W. Aldrich et al. and assigned to the assignee of the present invention. However, in the interest of a complete description the circuits are described below. A simplified description of the oscillator action is given in connection with oscillator 17 but not repeated for oscillator 19.

Unijunction relaxation oscillator 17 comprises unijunction transistor 20, the base 21 of which is connected through resistor 22 to the positive power supply terminal and the base 23 of which is connected through resistor 24 to the negative power supply terminal. The pulse repetition rate of the oscillator is determined by the values of the series-connected variable resistor 25 and capacitor 26 which are connected respectively to the positive and negative terminals of the source. The emitter 27 of unijunction transistor 20 is connected to the junction of variable resistor 25 and capacitor 26. The charging rate of capacitor 26 thus determines the firing of unijunction transistor 20 and therefore the pulse repetition rate of the oscillator 17. Upon application of the potential across the bases 21 and 23 of unijunction transistor 20, the device does not fire due to its characteristics. However, the capacitor 26 begins to charge by a back current flowing through a portion of the device and variable resistor 25. When the capacitor 26 is sufficiently charged it discharges rapidly between emitter 27 and base 23 and conditions return to those which obtained when the potential was first applied. The cycle repeats as long as the potential is applied to the unijunction and the repetition rate is determined by the value of variable resistor 25. Unijunction oscillator 17 provides a pulse output at its base 23 (due to firing of capacitor 26) which is applied through a pulse coupling diode 28 to gate 16 of GTO 11 to initiate its conduction. It is well to note that the pulse provided from pulse timing oscillator 17 is so short that it has not effect upon SCR 18.

The turn-off circuit for GTO 11 comprises SCR 18 and unijunction oscillator 19. As shown in FIGURE 2, gate 16 of GTO 11 is connected through resistor 29 to anode 30 of SCR 18. Cathode 31 of SCR 18 is connected to the negative power supply terminal. SCR 18 acts as a switch which is normally in a non-conductive state. When SCR 18 is turned on, or switched to its highly conductive state, its impedance is reduced to a minimal value. A gate turn-off circuit for GTO 11 is thereby provided, gate 16 of GTO 11 being connected through resistor 29 and SCR 18 to the negative power supply terminal.

The connection of load 14 between the cathode 13 of GTO 11 and the negative power supply terminal provides the same potential relationship between the cathode 13 and the gate 16 of GTO 11 upon turn-on of SCR 18 as that established between the cathode 3 and gate 4 of GTO 1 in the circuit of FIGURE 1 upon throwing switch 6 to its "off" position. More precisely, the gate 16 will be at a lower potential than the cathode 13 of GTO 11 when SCR 18 is turned on, thereby effecting the withdrawal of current from the gate 16 to turn off the GTO 11.

SCR 18 is switched on by the application of a pulse from unijunction oscillator 19 to its gate 32. Unijunction oscillator 19 comprises unijunction transistor 33, the base 34 of which is connected through resistor 35 to the positive power supply terminal and the base 36 of which is connected through resistor 37 to the negative power supply terminal. The emitter 38 of unijunction transistor 33 is connected to the junction of series connected capacitor 39 and variable resistor 40, the values of which control the firing rate of unijunction transistor 33. Capacitor 39 is connected to the negative power supply terminal, and resistor 40 is connected to the cathode 13 of GTO 11. Thus, the capacitor 39 is charged by the current conducted by GTO 11 when GTO 11 is turned on, the charging being at a rate dependent on the value of variable resistor 40. It is important to note that the pulse width oscillator is inoperative unless a load current is flowing through GTO 11. For this reason, turn-off SCR 18 is inoperative unless a current is flowing through load resistance 14.

In operation, the pulse output of unijunction oscillator 17 initiates conduction of GTO 11. The length of time that GTO 11 remains conductive is determined by the state of conduction of SCR 18. SCR 18 is conditioned for conduction by the pulse output of unijunction oscillator 17 in the sense that the pulser enders GTO 11 conductive. Once GTO 11 conducts a voltage is provided across load resistor 14 and across the series resistance 40 and capacitor 39 which constitutes the timing circuit for SCR firing oscillator 19. In addition, conduction of GTO 11 provides a voltage at the gate 16 which also appears as the anode voltage for SCR 18. Thus, when the timing capacitor 39 discharges through unijunction transistor 33 and applies a pulse to the gate 32 of SCR 18, the SCR 18 becomes conductive and connects gate 16 of GTO 11 to ground to turn the device off. This, of course, also removes voltage from the load resistor 14 and the firing circuit of oscillator 19.

Figure 3A:
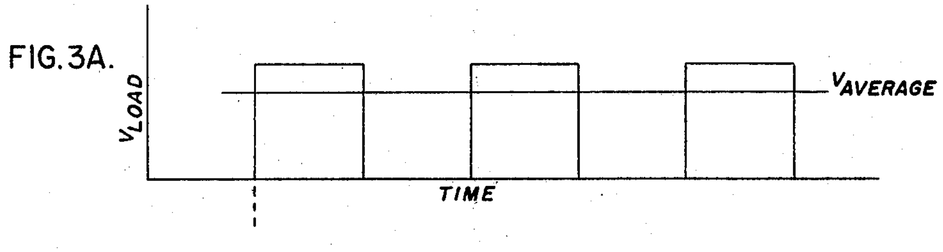
FIGURE 3 shows four graphs (3A, 3B, 3C and 3D) of load voltage plotted along the axis of ordinates and time plotted along the axis of abscissas to illustrate the use of the circuit of FIGURE 2 for both pulse width modulation (3A and 3B) and pulse timing modulation (3C and 3D).
Figure 3B:
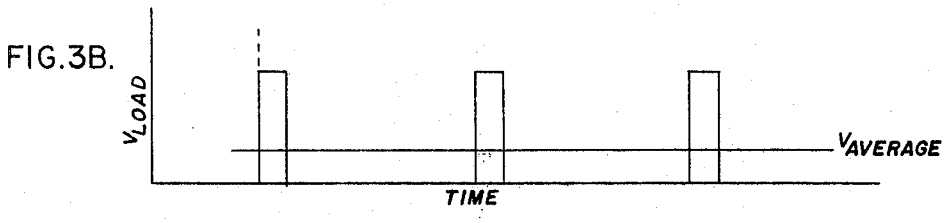

In order to obtain a better understanding of the types of modulation which can be obtained using the circuit of FIGURE 2, reference should be had to that circuit and the wave forms of FIGURES 3A and 3B. First, assume that the timing oscillator 17 has its RC timing circuit resistance 25 and capacitor 26 fixed so that it fires at a constant repetition rate. These two curves show a voltage pulse across the load at such a constant rate. The time at which SCR 18 is turned on during any given cycle, i.e., after any given pulse in the output of unijunction oscillator 17, is determined by the pulse output of unijunction oscillator 19. Since the RC timing circuit of unijunction transistor 33 is energized by the flow of load current when GTO 11 is turned on, and thus in timed relationship with the turn-on of GTO 11, proper timing of the charging of capacitor 39 is achieved. Further, the rate of charge of capacitor 39 may be changed by varying the value of variable resistor 40 to set the time at which, during any given cycle, unijunction oscillator 33 will provide an output pulse to trigger SCR 18 into conduction. For example, assume a given value for variable resistor 40 which gives a pulse width and average load voltage $V_{Ave}$ as illustrated in FIGURE 3A. When the value of variable resistor 40 is reduced the firing rate of oscillator 19 is increased and, therefore, the width of the load pulses are reduced (time of conduction of GTO 11 is reduced). This means that the average load voltage is reduced as illustrated in FIGURE 3B. Diode 28 is provided to prevent flow of negative gate current from GTO 11 back through resistor 24 which would immediately turn off GTO 11 when it is triggered on rather than allowing the pulse width control provided by oscillator 19.

Figure 3C:
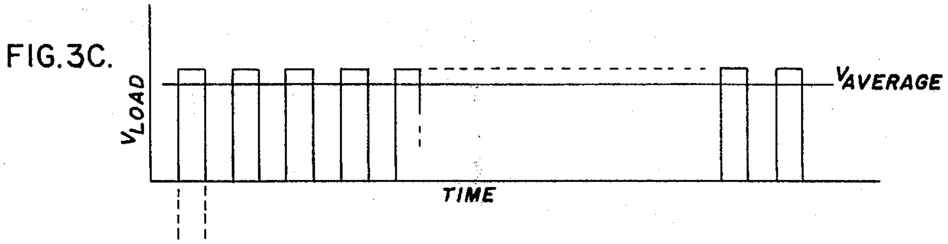
Figure 3D:
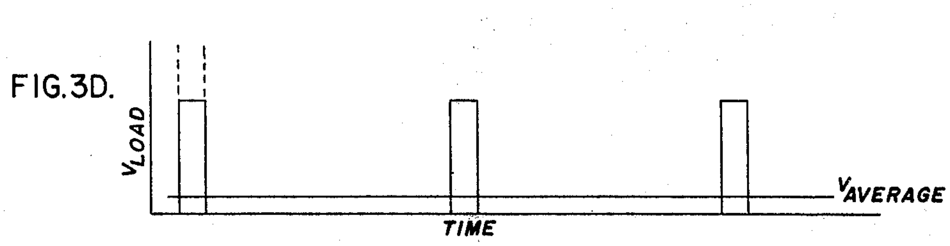

For pulse time modulation the value of resistor 25 is varied to provide a different firing rate for oscillator 17. Assume, for example, that the firing of oscillator 19 is adjusted to give pulses of the width illustrated in FIGURE 3B but resistor 25 is reduced in value so that oscillator 17 fires faster. This condition is illustrated in FIGURE 3C. The pulses come more frequently than those of FIGURE 3B and thus provide a higher average voltage. By increasing the magnitude of resistor 25, oscillator 17 fires more slowly (less frequently and the distance between pulses is spread in time) as illustrated in FIGURE 3D and the average voltage is reduced. These examples should suffice to show that the firing of both circuits can be simultaneously varied to provide simultaneous pulse width and pulse timing modulation.

Thus, the circuit of FIGURE 2 provides a relatively simple and low cost, but highly efficient and safe arrangement wherein the setting of a variable resistor 40 and or a variable resistor 25 in a low current control circuit permits varying the average load current from near zero to full on. Alternatively, an electrical control may be provided by utilizing a transistor as a variable impedance in the timing circuit of either unijunction oscillator 19 alone or of unijunction oscillator 17 alone or both. In the form shown in FIGURE 2, a NPN transistor 41 is connected in parallel with the capacitor 39. Conduction of transistor 41 is controlled in the conventional manner by varying its base current. As conduction of transistor 41 is varied, the rate of charge of capacitor 39 is varied. Thus, transistor 41 also controls pulse width modulation. Various other embodiments are also possible, such as placing a transistor in parallel with both resistor 40 and capacitor 39; also, a transistor may be used in place of resistor 40 or in series with resistor 40. These arrangements can also be provided with resistor 25 and capacitor 26. In any of these embodiments, the value of the electrical signal applied to the base of the transistor will serve to vary its impedance and thus the charging rate of the associated capacitor (39 or 26). In these alternative embodiments, the resistor (25 or 40) may be of a fixed value.

In summary, this invention provides circuitry, relatively simple and inexpensive in construction but highly efficient and durable in operation, for the control of load currents by a relatively low current level control signal which initiates and terminates the conduction of a GTO.

The efficiency of the over-all circuit is high since the energy required to control the load current is only that which is required to turn on or turn off the GTO. Thus, the turn-on and turn-off switching or triggering signals may be of the same order of absolute magnitude, whereby the control circuitry is operative at relatively low current levels for both switching modes. Further, simple static switches may be employed without the need of capacitive or inductive elements to effect the switching control. No maximum limit on load current pulse duration exists because there is no way for capacitor charges, if they exist, to leak off. Due to the circuitry configurations as herein disclosed, the forward voltage rating of the GTO need be no higher than the line voltage and only very low reverse blocking capabilities are required. Thus, full utilization of the voltage rating capabilities of the particular GTO employed is possible.

Although the invention has been described with reference to specific embodiments, the invention is not limited to these embodiments and modifications would be obvious to those skilled in the art. It is thus intended that the invention is not limited to the particular details shown and described which may be varied without departing from the spirit and scope of the invention and the appended claims.

What is claimed as new and desired to be secured by Letters Patent of the United States is:

1. A circuit for controlling the state of conduction of a gate turn off switch comprising:

(a) a gate turn off switch having an anode, a cathode, and a gate, (b) said anode being connected to a positive power supply terminal, (c) said cathode being connected through a load resistance to a negative power supply terminal, (d) means to connect said gate to a potential source which renders said gate positive relative to said cathode to turn said gate turn off switch "on" and to connect said gate to said negative terminal to turn said gate turn off switch "off."

2. A circuit for controlling the state of conduction of a gate turn off switch as described in claim 1 wherein:

(a) a capacitor is connected in parallel with said load resistance to be charged by the flow of current when said gate turn off switch is turned "on,"

(b) whereby, when said gate is connected to said negative terminal, the charge on said capacitor maintains said cathode at a potential in excess of the potential of said gate to assist said turn-off of said gate turn-off switch.

3. A circuit for controlling the state of conduction of a gate turn-off switch comprising:

(a) a gate turn-off switch having an anode, a cathode, and a gate, (b) said anode being connected to a positive power supply terminal, (c) said cathode being connected through a load resistance to a negative power supply terminal, (d) switch means connecting said gate to a potential between that of said positive and negative terminals to turn said gate turn-off switch "on" and to said negative terminal to turn said gate turn-off switch "off."

4. A circuit for controlling the state of conduction of a gate turn-off switch comprising:

(a) a gate turn-off switch having an anode, a cathode, and a gate, (b) said anode being connected to a positive power supply terminal, (c) said cathode being connected through a load resistance to a negative power supply terminal, (d) switch means for selectively connecting said gate through a first resistive path to said positive terminal to turn said gate turn-off switch "on" and through a second resistive path to said negative terminal to withdraw current from said gate to turn said gate turn-off switch "off."

5. A circuit for controlling the state of conduction of a gate turn-off switch as described in claim 4 wherein:

(a) a capacitor is connected in parallel with said load resistance to be charged by the flow of current when said gate turn-off switch is turned "on,"

(b) whereby, when said gate is connected to said negative terminal, the charge on said capacitor maintains said cathode at a potential in excess of the potential of said gate to assist said turn-off of said gate turn-off switch.

6. A pulse-width modulation circuit for controlling the state of conduction of a gate turn-off switch comprising:

(a) a gate turn-off switch having an anode, a cathode, and a gate, (b) said anode being connected to a positive power supply terminal, (c) said cathode being connected through a load resistance to a negative power supply terminal, (d) first means providing periodic output pulses to said gate to turn said gate turn-off switch "on,"

(e) a normally non-conductive switch, connected between said gate and said negative terminal, (f) means to condition said switch for triggering to a highly conductive state responsive to each of said periodic output pulses, (g) second means to trigger said switch to said highly conductive state at a predetermined time following the commencement of each of said periodic output pulses to provide a conductive path between said gate and said negative terminal to turn said gate turn-off switch "off."

7. A pulse-width modulation circuit for controlling the state of conduction of a gate turn-off switch as described in claim 6 wherein:

(a) a capacitor is connected in parallel with said load resistance to be charged by the flow of current when said gate turn-off switch is turned "on,"

(b) whereby, when said conductive path is established between said gate and said negative terminal, the charge on said capacitor maintains said cathode at a potential in excess of the potential of said gate to assist said turn-off of said gate turn-off switch.

8. A pulse-width modulation circuit for controlling the state of conduction of a gate turn-off switch as described in claim 6 wherein:

a unilaterally conductive device connects said first means to said gate of said gate turn-off switch to isolate said first means when said switch is triggered to said highly conductive state.

9. A pulse-width modulation circuit for controlling the state of conduction of a gate turn-off switch comprising:

(a) a first gate turn-off switch having an anode, a cathode, and a gate, (b) said anode of said first gate turn-off switch being connected to a positive power supply terminal, (c) said cathode of said first gate turn-off switch being connected through a load resistance to a negative power supply terminal, (d) a first unijunction relaxation oscillator providing periodic output pulses and arranged to apply said periodic output pulses to said gate of said first gate turn-off switch to turn said first gate turn-off switch "on,"

(e) a gate controlled device having an anode, a cathode, and a gate, (f) said anode of said gate controlled device being connected to the gate of said first gate turn-off switch, (g) said cathode of said gate controlled device being connected to said negative power supply terminal, (h) said gate controlled device being conditioned for turn-on by each of said output pulses of said first oscillator, (i) a second unijunction relaxation oscillator including a timing circuit, (j) said timing circuit being connected to said cathode of said first gate turn-off switch and energized by the flow of current through said first gate turn-off switch when said first gate turn-off switch is turned "on" to effect triggering of said second oscillator, (k) said second oscillator providing an output pulse when triggered by said timing circuit and arranged to apply said output pulse to said gate of said gate controlled device, (l) said output pulse turning said gate controlled device "on" to provide a conductive path for connecting said gate of said first gate turn-off switch to said negative power supply terminal to turn said first gate turn-off switch "off."

10. A pulse-width modulation circuit for controlling the state of conduction of a gate turn off switch as described in claim 9 wherein:

(a) a capacitor is connected in parallel with said load resistance to be charged by the flow of current when said gate turn off switch is turned "on,"

(b) whereby, when said gate is connected to said negative terminal, the charge on said capacitor maintains said cathode at a potential in excess of the potential of said gate to assist said turn-off of gate turn off switch.

11. A pulse-width modulation circuit for controlling the state of conduction of a gate turn off switch as described in claim 9 wherein:

said timing circuit includes variable means for adjusting the time following said commencement of each of said output pulses of said first oscillator at which said second oscillator is triggered.

12. A pulse-width modulation circuit for controlling the state of conduction of a gate turn off switch as described in claim 11 wherein:

said variable means comprises a variable resistor in said triggering circuit.

13. A pulse-width modulation circuit for controlling the state of conduction of a gate turn off switch as described in claim 11 wherein:

said variable means comprises a transistor in said triggering circuit.

14. In a switching circuit to control the duration and repetition rate of voltage pulses applied to a load (a) a gate turn off switch having an anode, cathode, and a gate, (b) said anode being connected to a positive power supply terminal, (c) said cathode connected through a load resistance to a negative power supply terminal, (d) first means providing output pulses to said gate to turn said gate turn off switch "on,"

(e) a normally non-conductive switch, connected between said gate and said negative terminal, (f) means to condition said switch for triggering to a highly conductive state responsive to each of said output pulses, (g) second means to trigger said switch to said highly conductive state at a predetermined time following the commencement of each of said output pulses to provide a conductive path between said gate and said negative terminal to turn said gate turn off switch "off."

15. A circuit as described in claim 14 for providing pulse timing modulation wherein:

means is provided to vary the rate of pulse generation of said first means.

16. A circuit as described in claim 14 for providing pulse timing and pulse width modulation wherein:

(a) means is provided to vary the rate of pulse generation of said first means whereby pulse timing modulation may be provided and (b) means is provided to vary the time following the commencement of each of said output pulses that second means triggers said switch to said highly conductive state whereby pulse width modulation is provided.

References Cited by the Examiner

UNITED STATES PATENTS

| | | | |
|---|---|---|---|
| 2,780,752 | 2/1957 | Aldrich et al. | 331—111 |
| 3,189,759 | 6/1965 | Laishley | 307—88.5 |

OTHER REFERENCES

Solid-State Thyratron Switches Kilowatts, Frenzel and Gutzwiller, Electronics, March 1958; Controlled Rectifier Manual, General Electric, 1960, pp. 55, 107, 113.

GE Application Note 200.23, "PNPN Switches With Gate Turn-Off Control," pages 6 and 7, May 1962.

References Cited by the Applicant

UNITED STATES PATENTS

| | | |
|---|---|---|
| 2,877,359 | 3/1959 | Ross. |

FOREIGN PATENTS

| | | |
|---|---|---|
| 1,103,389 | 3/1961 | Germany. |

HERMAN KARL SAALBACH, *Primary Examiner.*

ARTHUR GAUSS, *Examiner.*

P. L. GENSLER, ALFRED L. BRODY, E. LIEBERMAN, B. P. DAVIS, *Assistant Examiners.*